(12) United States Patent
Cho et al.

(10) Patent No.: US 7,892,355 B2
(45) Date of Patent: Feb. 22, 2011

(54) PREPARATION OF SINGLE-CRYSTALLINE POLYALKYLTHIOPHENE STRUCTURES BY SURFACE-INDUCED SELF-ASSEMBLY

(75) Inventors: Kilwon Cho, Pohang-si (KR); Do Hwan Kim, Pohang-si (KR)

(73) Assignees: Postech Foundation (KR); Postech Academy-Industry Foundation (KR)

( * ) Notice: Subject to any disclaimer, the term of this patent is extended or adjusted under 35 U.S.C. 154(b) by 855 days.

(21) Appl. No.: 11/894,169

(22) Filed: Aug. 20, 2007

(65) Prior Publication Data

US 2008/0041300 A1 Feb. 21, 2008

Related U.S. Application Data

(60) Provisional application No. 60/840,788, filed on Aug. 28, 2006.

(30) Foreign Application Priority Data

Aug. 21, 2006 (KR) ...................... 10-2006-0078746

(51) Int. Cl.
*C30B 19/12* (2006.01)
(52) U.S. Cl. ............................ 117/48; 117/50; 117/71; 117/72; 117/70; 117/68

(58) Field of Classification Search .................... 117/68, 117/71, 72, 73, 48, 50
See application file for complete search history.

(56) References Cited

U.S. PATENT DOCUMENTS

2005/0098204 A1 5/2005 Roscheisen et al.
2006/0021647 A1 2/2006 Gui et al.

FOREIGN PATENT DOCUMENTS

WO WO 87/00679 1/1987
WO WO 03/081683 10/2003

*Primary Examiner*—Robert M Kunemund
(74) *Attorney, Agent, or Firm*—Baker Hostetler LLP

(57) ABSTRACT

A high quality single-crystalline polyalkylthiophene structure can be easily prepared by the inventive method which comprises: (i) dissolving polyalkylthiophene in an organic solvent at a temperature ranging from 50 to 100° C., sequentially quenching the polyalkylthiophene solution at a temperature ranging from 25 to 40° C. and then at −5 to 15° C., to obtain a self-seeding polyalkylthiophene solution; and (ii) applying the self-seeding polyalkylthiophene solution obtained in step (i) to one surface of a nano-template having a hydrophobic supramolecule coating layer formed thereon to induce self-assembly and crystallization of polyalkylthiophene on the surface.

10 Claims, 6 Drawing Sheets

PREPARATION OF SINGLE-CRYSTALLINE POLYALKYLTHIOPHENE STRUCTURES BY SURFACE-INDUCED SELF-ASSEMBLY

FIELD OF THE INVENTION

The present invention relates to a method for preparing high quality single-crystalline π-conjugated polymer structures by surface-induced self-assembly, which are useful for the manufacture of a supramolecular optoelectronic device.

BACKGROUND OF THE INVENTION

Electronically active π-conjugated polymers are of special interests in the field of a supramolecular optoelectronic device due to the fact that regulated nano- or micro-sized structures can be prepared by taking advantage of their self-assembly capability to form intra-chain stacking through π-π interactions (see [J. P. Hill, W. Jin, A. Kosaka, T. Fukushima, H. Ichihara, T. Shimomura, K. Ito, T. Hashizume, N. Ishii, and T. Aida, *Science*, 304, 1481 (2004)]).

One of such conjugated polymer structures is a one-dimensional (1D) nano or microwire obtained by self-assembly of hexa-peri-hexabenzocoronene (HBC) derivatives which are discotic liquid crystal conjugated polymers (see [M. D. Watson, F. Jäckel, N. Severin, J. P. Rabe, and K. Müllen, *J. Am. Chem. Soc.*, 126, 1402 (2004)]).

In addition, there has been reported a method of preparing several nano-sized, self-assembled graphite tubes by way of controlling in a solution the π-π stacking of amphiphilic HBC derivatives (see [W. Jin, T. Fukushima, M. Niki, A. Kosaka, N. Ishii, and T. Aida, *Proc. Natl. Acad. Sci. USA*, 102, 10801 (2005)]).

However, the conventional methods mentioned above have the problem that they are not appropriate for the formation of a high-quality single-crystalline structure. Further, when the conventional self-assembled products prepared in a solution are applied to an electronic device, it is hard to match them in line with the desired orientation required therein, and it becomes difficult to maintain a regulated array over a large area.

SUMMARY OF THE INVENTION

Accordingly, it is an object of the present invention to provide a method for preparing a single-crystalline conjugated polymer structure which is capable of providing a regulated array over a large area, a low electric resistance and an improved field-effect property when applied to a supramolecular electronic device.

In accordance with one aspect of the present invention, there is provided a method for preparing a single-crystalline polyalkylthiophene structure, which comprises:

(i) (i-a) dissolving polyalkylthiophene in an organic solvent at a temperature ranging from 50 to 100° C., quenching the polyalkylthiophene solution at a temperature ranging from 25 to 40° C. and keeping the quenched solution at that temperature for at least 1 hr, and (i-b) further quenching the solution obtained in step (i-a) at a temperature ranging from −5 to 15° C., followed by stirring at that temperature for a period of 10 to 48 hrs, to obtain a self-seeding polyalkylthiophene solution; and (ii) applying the self-seeding polyalkylthiophene solution obtained in step (i) to one surface of a nano-template having a hydrophobic supramolecule coating layer formed thereon to induce self-assembly of polyalkylthiophene on the surface and allowing the growth of polyalkylthiophene crystals thereon.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

The method of the present invention is characterized by the steps of forming a self-seeding solution of the electronically active conjugated polymer, polyalkylthiophene, and then applying the self-seeding solution to one surface of a nano-template modified with a hydrophobic supramolecule, to obtain a single-crystalline polyalkylthiophene self-assembly in the form of a nano or microstructure.

<Step (i)>

In step (i) of the inventive method, polyalkylthiophene is dissolved in an organic solvent at a temperature ranging from 50 to 100° C., and the solution is quenched by lowering the solution temperature to 25 to 40° C. and keeping the quenched solution at that temperature for at least 1 hr (step (i-a)). Then, the resulting solution is further quenched by further lowering the solution temperature to −5 to 15° C. and further stirred at that temperature for a period of 10 to 48 hrs, to form a self-seeding polyalkylthiophene solution (step (i-b)).

Representative examples of the polyalkylthiophene used in the present invention include polybutylthiophene, polyhexylthiophene, polyoctylthiophene, polydecylthiophene, polydodecylthiophene and a mixture thereof.

The polyalkylthiophene solution is subjected sequentially to two quenching steps (i-a) and (i-b), the first quenching at 25 to 40° C. of step (i-a) being the step for conferring on the polymer in the solution an entropic energy necessary for the generation of seed cores, and the second quenching at −5 to 15° C. of step (i-b), for substantially generating the desired seeds.

In step (i), the concentration of the polyalkylthiophene solution is preferably in the range of 0.1 to 1 mg/ml. When the concentration is higher than 0.3 mg/ml, a film may be formed instead of a desired single-crystalline structure such as a nano- or micro-wire, during the crystal growth process in step (ii).

The organic solvent which may be used in the present invention includes chloroform ($CHCl_3$), toluene, xylene, chlorobenzene, dichlorobenzene, trichlorobenzene and a mixture thereof, among which chloroform is preferred.

In step (i-b), the polyalkylthiophene solution quenched at −5 to 15° C. is maintained for a period of 10 to 48 hrs with stirring. In case the stirring time is shorter than 10 hrs, the amount of a single-crystalline structure formed may be too low. If the stirring time is longer than 48 hrs, the amount of seeds may become excessively high, resulting in the formation of undesired single-crystalline granules.

<Step (ii)>

In step (ii) of the inventive method, the self-seeding solution obtained in step (i) is applied to one surface of a nano-template having a hydrophobic supramolecule coating layer formed thereon to induce the self-assembly of polyalkylthiophene on the surface as well as the growth of polyalkylthiophene crystals thereon.

Figure 1:
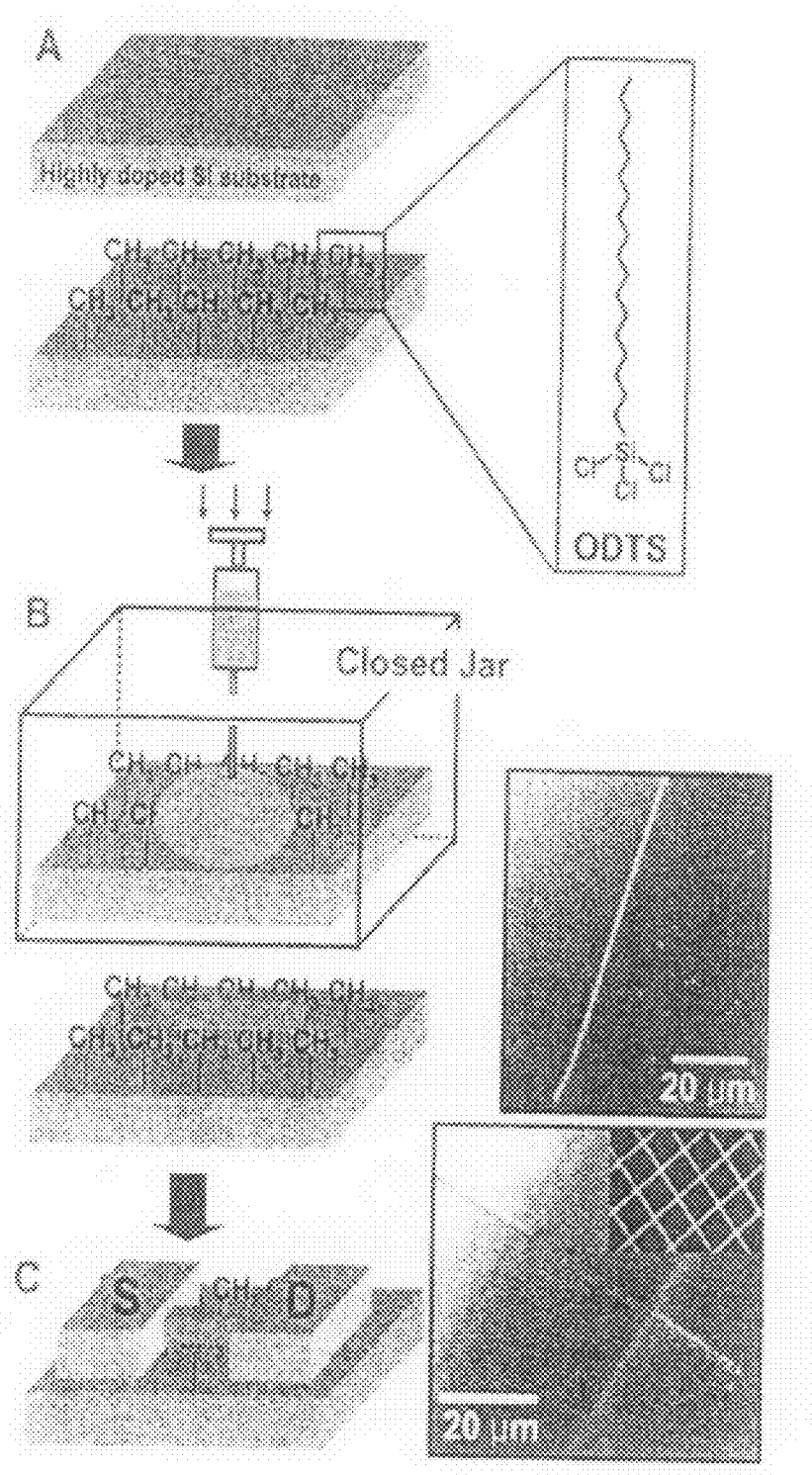
FIG. 1: a schematic view of the manufacturing process of the single-crystalline conjugated polymer structure in accordance with one embodiment of the present invention.

FIG. 1 illustrates a schematic view of the manufacturing process of the single-crystalline conjugated polymer structure in accordance with one embodiment of the present invention.

The nano-template with a hydrophobic supramolecule coating layer may be prepared by modifying one surface of a silicon dioxide plate with a hydrophobic supramolecule, preferably by coating one surface of the silicon dioxide plate with a supramolecule solution in an organic solvent (e.g., toluene), followed by conducting a condensation reaction of the supramolecule with the silicon dioxide surface at a temperature ranging from 110 to 120° C. (FIG. 1(A)). The supramolecule monolayer dielectric formed on the silicon dioxide is highly ordered and molecularly flat.

Representative examples of the supramolecule used in the present invention include octadecyltrichlorosilane (ODTS), dodecyltrichlorosilane (DDTS), hexadecyltrichlorosilane (HDTS) and a mixture thereof, octadecyltrichlorosilane (ODTS) being preferred.

The self-seeding solution obtained in step (i) is added dropwise to the surface of the nano-template having the hydrophobic supramolecule coating layer to induce crystallization of polyalkylthiophene by self-assembly on the supramolecule layer of the nano-template, thereby forming a single-crystalline polyalkylthiophene structure thereon. During the above process, the polyalkylthiophene chains self-organize through π-π interactions. One of the key requirements for the spontaneous organization of polyalkylthiophene chains into 1D structures is the presence of an increased solvent vapor pressure. It is envisaged that the solvent vapor pressure in an air-tight reactor prevents fast evaporation of the solvent from the polyalkylthiophene solution during self-assembly. For example, for the purpose of minimizing the evaporation of the solvent of the self-seeding solution during the crystal growth process, the solution-application and crystallization steps may be conducted within an air-tight jar maintained under an Ar atmosphere (FIG. 1(B)). The nano-template may be kept at a temperature ranging from 10 to 50° C. during the solution addition process.

The single-crystalline polyalkylthiophene structure thus grown may have a length of 30 nm to 200 μm and a thickness of 20 nm to 1 μm.

In accordance with the present invention, a supramolecular optoelectronic device is prepared by a conventional method using the inventive single-crystalline polyalkylthiophene structure. For example, as shown in FIG. 1(C), a supramolecular optoelectronic device may be obtained by adhering a copper grid shadow mask to the inventive single-crystalline structure fabricated on the nano-template substrate, and then forming source and drain Au electrodes thereon.

As described above, in accordance with the method of the present invention, a high quality single-crystalline polyalkylthiophene nano or microstructure which is capable of providing a regulated array over a large area, a low electric resistance and an improved field effect property may be easily prepared. Thus, the inventive single-crystalline nano or microstructure is useful for the manufacture of various supramolecular optoelectronic devices including high performance and integrated supramolecular transistors, supramolecular light-emitting devices and supramolecular bio-sensors.

The following Examples are given for the purpose of illustration only, and are not intended to limit the scope of the invention.

EXAMPLE 1

Preparation of Single-crystalline poly(3-hexylthiophene) Structure

Poly(3-hexylthiophene) (available from Rieke Matels Inc.) was dissolved in chloroform to a concentration of 0.1 mg/ml at 60-70° C., and the solution was quenched by lowering the temperature to 30-35° C., which was kept at the same temperature for 1 hr. The resulting solution was further quenched at 10-15° C. and stirred at the same temperature for 10-12 hrs, to obtain a poly(3-hexylthiophene) solution containing formed seeds.

Separately, a silicon dioxide plate was washed with a piranha solution ($H_2SO_4:H_2O_2=7:3$) and the washed plate was coated with a 10 mM octadecyltrichlorosilane (ODTS) supramolecule solution in toluene (available from Aldrich) to induce condensation at 110-120° C. for 1 hr. The resulting plate was dried at 120° C. to obtain a nano-template having a 2.5 nm ODTS coating layer.

The nano-template thus prepared was placed in an air-tight jar maintained under an Ar atmosphere. Then, the self-seeding poly(3-hexylthiophene) solution previously prepared was added dropwise to the ODTS coating layer of the nano-template at 10-50° C., to induce the formation thereon of poly(3-hexylthiophene) single crystals (length: 30 nm-200 μm, thickness: 20 nm-1 μm) through surface-induced self-assembly.

TEST EXAMPLE 1

Structural Analysis of Single-crystalline poly(3-hexylthiophene) Structure

Figure 2:
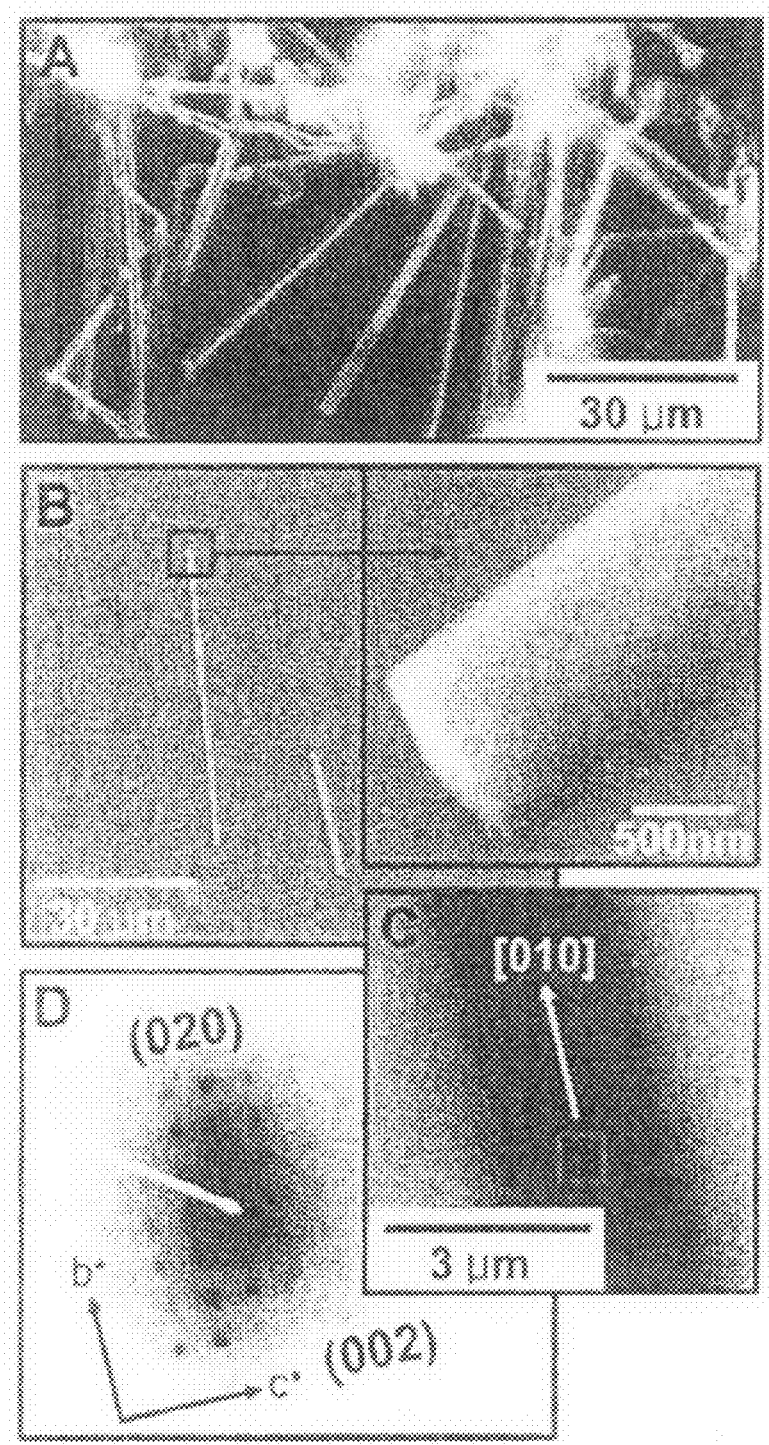
FIG. 2: an optical microscope photograph (A), a scanning electron microscope (SEM) photograph (B), a transmission electron microscope (TEM) photograph (C) and a selected-area electron diffraction (SAED) pattern (D) of the single-crystalline poly(3-hexylthiophene) microwire obtained in Example 1.

An optical microscope photograph (A), a scanning electron microscope (SEM) photograph (B), a transmission electron microscope (TEM) photograph (C) and a selected-area electron diffraction (SAED) pattern (D) of the single-crystalline structure obtained in Example 1 are shown in FIG. 2. Schematic views of the unit lattice (E) and inner structure (F) thereof are shown in FIG. 3.

In FIG. 2, the photographs (A) and (B) demonstrate that the single crystal structure produced is of the form of a bundle of predominantly straight microwires with well-defined facets.

Figure 3:
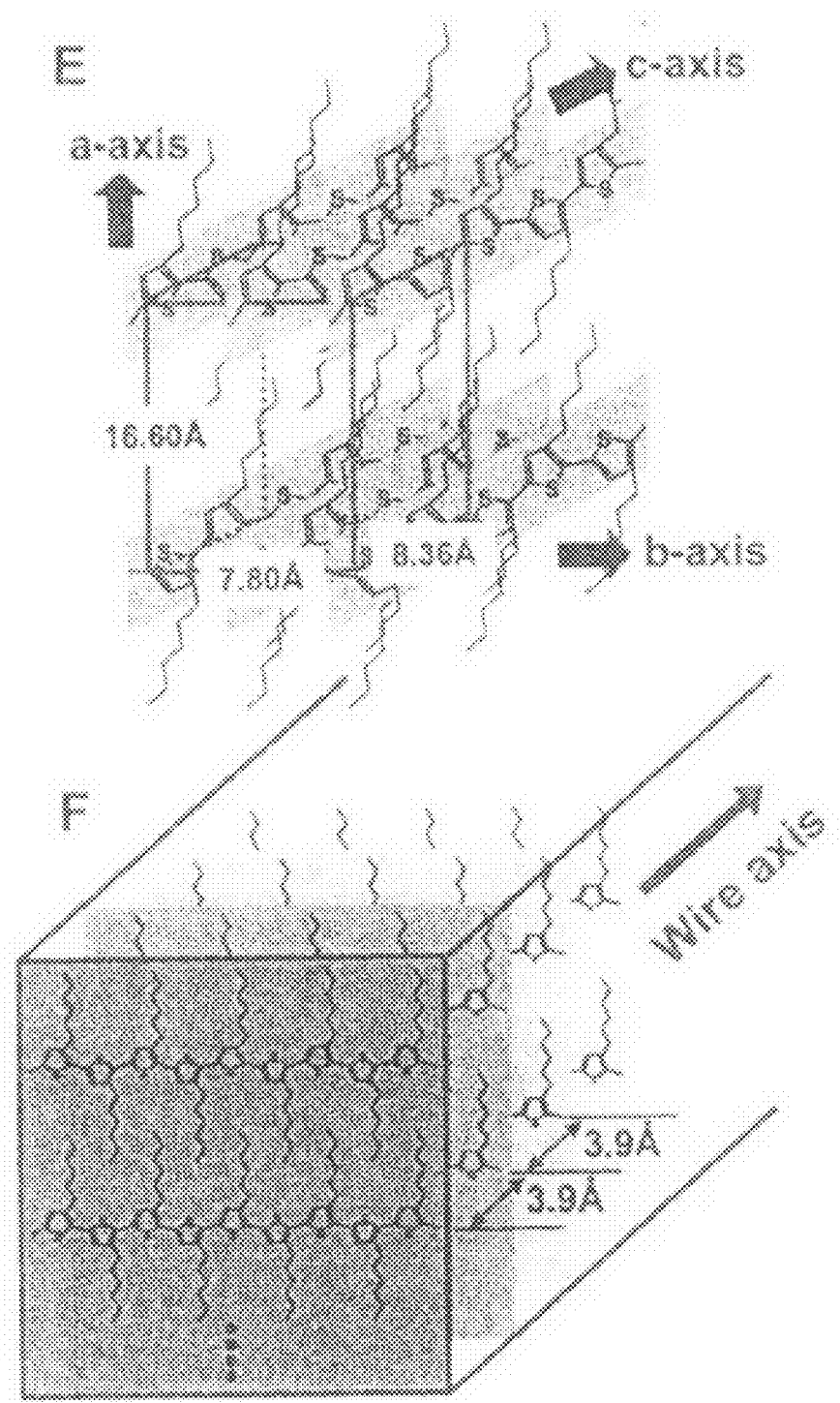
FIG. 3: schematic views, respectively, of the unit lattice (E) and inner structure (F) of the single-crystalline poly(3-hexylthiophene) microwire obtained in Example 1.

In addition, as can be seen from the TEM photograph (C) and SAED pattern (D) of FIG. 2 as well as the molecular and crystallographic structures (E, F) of FIG. 3, the microwires preferentially grew along the [010] (b-axis) direction along which the chains become stacked through intramolecular π-π interaction. The growth direction coincides with the two-dimensional (2D) charge transporting direction, the microwires having an orthorhombic crystal unit cell with specific lattice constants: a≈16.60 Å, b≈7.80 Å and c≈8.36 Å. In other words, it is confirmed that the inventive poly(3-hexylthiophene) microwires have an 1D single-crystalline structure where the growth direction of the crystals and the overlapping direction of chains are identical to each other.

EXAMPLE 2

Preparation of Supramolecular Electronic Device

A copper grid shadow mask was attached to the single-crystalline poly(3-hexylthiophene) structure fabricated on the nano-template obtained in Example 1. Then, source and drain Au electrodes were formed thereon in accordance with a conventional method to prepare a supramolecular electronic device shown in FIG. 1(C) and FIG. 4(G).

TEST EXAMPLE 2

Determination of Supramolecular Electronic Device

Figure 4:
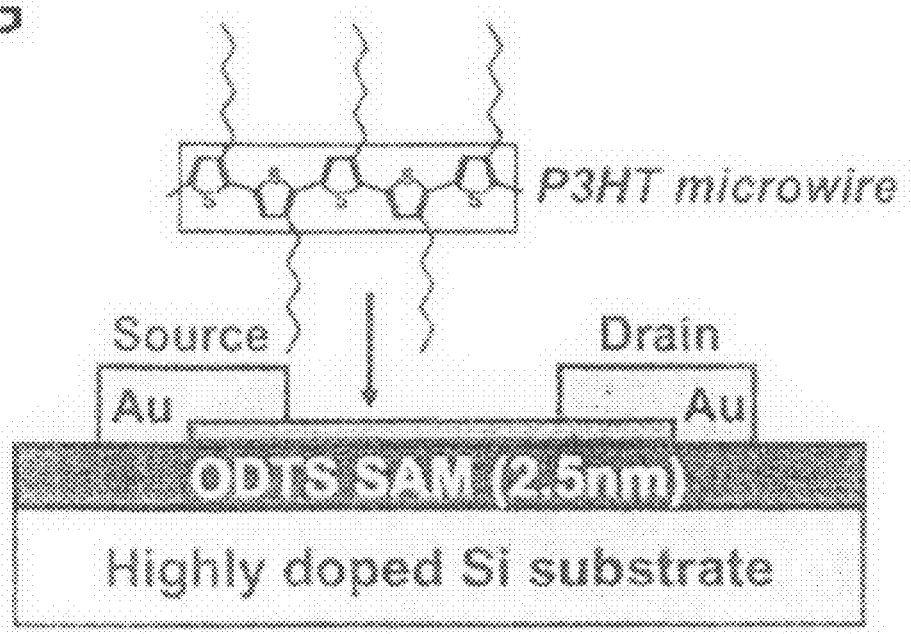
FIG. 4: a schematic representation (G) and an optical microscopic image (H) of the supramolecular electronic device obtained in Example 2.
Figure 4:
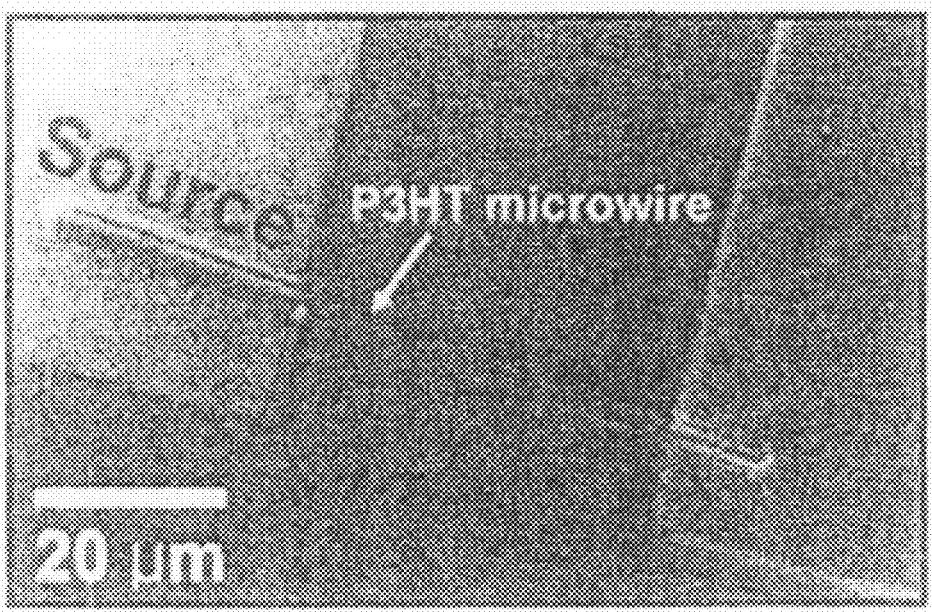

An optical microscopic image of the supramolecular electronic device obtained in Example 2 is shown in FIG. 4-H.

Figure 5:
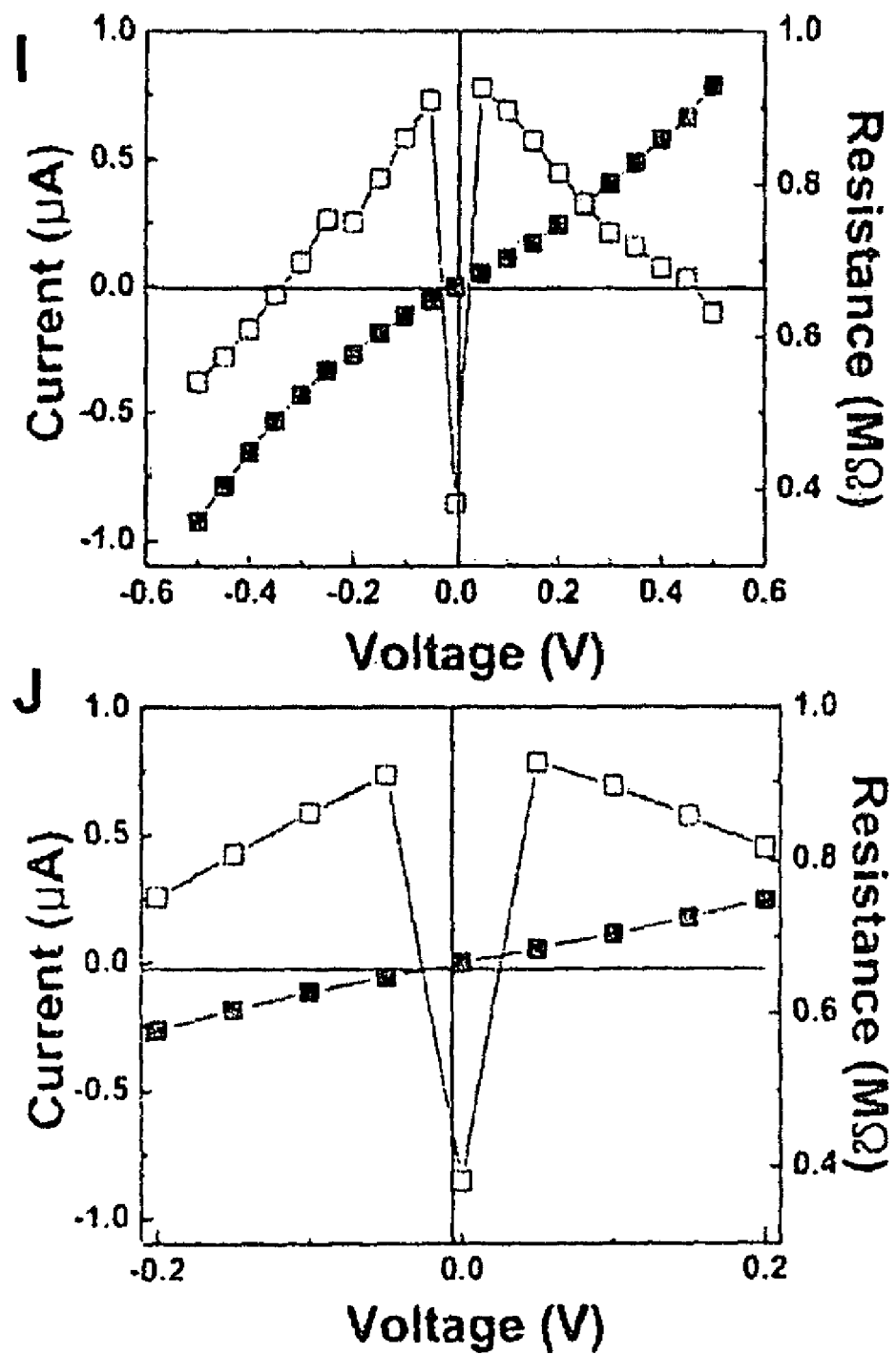
FIG. 5: the changes in the respective current (μA) and resistance (MΩ) with voltage (V) of the supramolecular electronic device obtained in Example 2.

Current-voltage and resistance-voltage curves are shown in FIG. 5, FIG. 5-J being a magnified portion of FIG. 5-I. The results suggest that the inventive supramolecular electronic device exhibits enhanced properties, i.e., low resistance (e.g., 0.5 Mohm) (curve (i)) and high current characteristics (e.g., 25 μA) (curve (ii)), which are comparable to those of an inorganic electronic device. As can be seen from the curves, as the applied voltage increases, the resistance of the inventive electronic device changes in proportion to the change of voltage (ohm's rule) in the low voltage-application region (ohmic region), but exhibits a space-charge-limited current behavior beyond the ohm's rule in the high voltage-application region.

Figure 6:
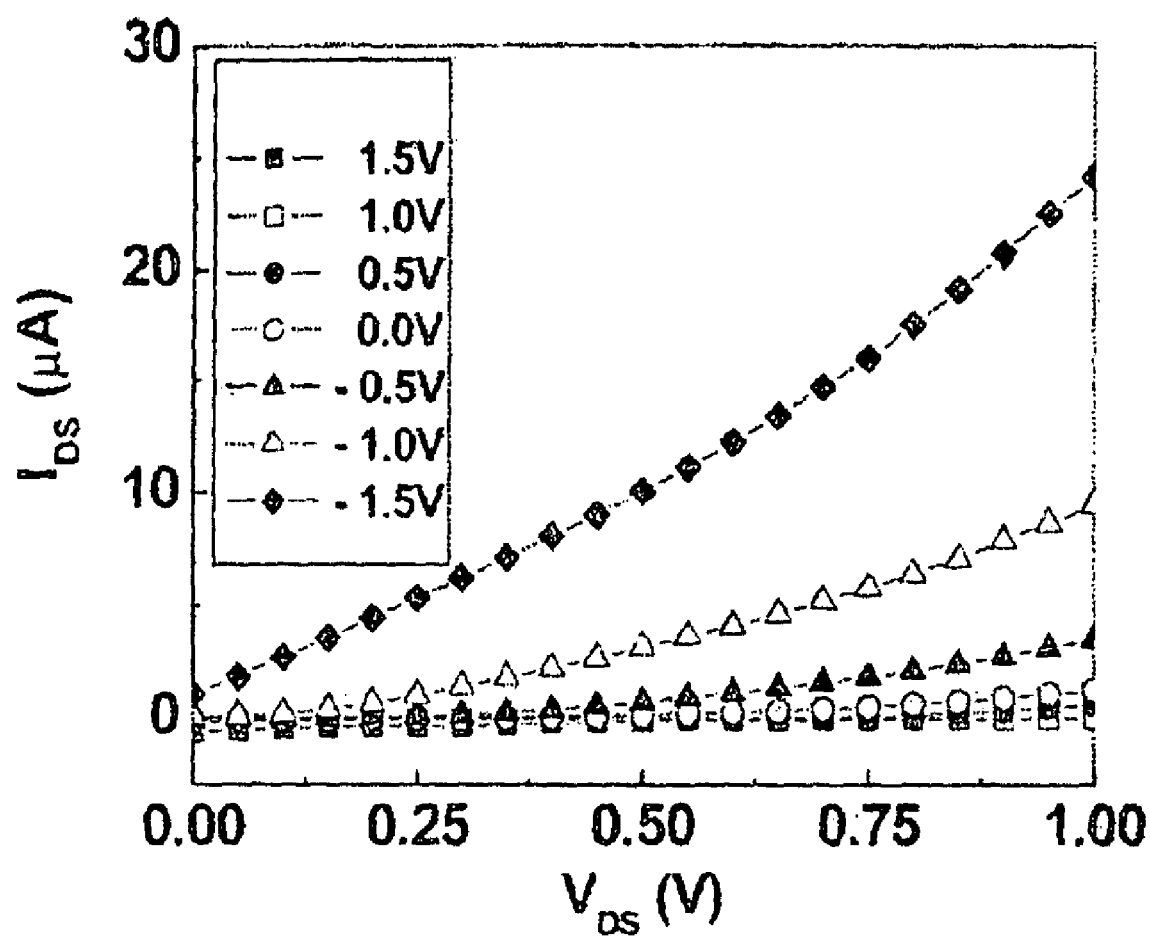
FIG. 6: the variation in the current (μA) as function of voltage (V) applied between the source and drain electrodes of the supramolecular electronic device obtained in Example 2.

In addition, the variation in the current as function of the voltage flowing between the source and drain electrodes at various voltage values (−1.5V~1.5V) applied to the gate electrode is shown in FIG. 6. The curves of FIG. 6 show the gate-dependence is observed at low voltages, which suggests that the inventive electronic device has improved field-effect properties.

As described above, in accordance with the method of the present invention, a high quality single-crystalline polyalkylthiophene structure which is capable of providing a regulated array over a large area, a low electric resistance and an improved field-effect property can be prepared easily.

While the invention has been described with respect to the above specific embodiments, it should be recognized that various modifications and changes may be made to the invention by those skilled in the art which also fall within the scope of the invention as defined by the appended claims.

What is claimed is:

1. A method for preparing a single-crystalline polyalkylthiophene structure, which comprises:
   (i) (i-a) dissolving polyalkylthiophene in an organic solvent at a temperature ranging from 50 to 100° C., quenching the polyalkylthiophene solution at a temperature ranging from 25 to 40° C. and keeping the quenched solution at that temperature for at least 1 hr, and (i-b) further quenching the solution obtained in step (i-a) at a temperature ranging from −5 to 15° C., followed by stirring at that temperature for a period of 10 to 48 hrs, to obtain a self-seeding polyalkylthiophene solution; and
   (ii) applying the self-seeding polyalkylthiophene solution obtained in step (i) to one surface of a nano-template having a hydrophobic supramolecule coating layer formed thereon to induce self-assembly of polyalkylthiophene on the surface and allowing the growth of polyalkylthiophene crystals thereon.

2. The method of claim 1, wherein the polyalkylthiophene solution used in step (i) has a concentration ranging from 0.1 to 1 mg/ml.

3. The method of claim 1, wherein the organic solvent used in step (i) is selected from the group consisting of chloroform, toluene, xylene, chlorobenzene, dichlorobenzene, trichlorobenzene and a mixture thereof.

4. The method of claim 1, wherein the nano-template used in step (ii) is prepared by coating one surface of a silicon dioxide plate with a hydrophobic supramolecule solution and inducing a condensation reaction thereof at a temperature ranging from 110 to 120° C.

5. The method of claim 1, wherein the hydrophobic supramolecule used in step (ii) is selected from the group consisting of octadecyltrichlorosilane, dodecyltrichlorosilane, hexadecyltrichlorosilane and a mixture thereof.

6. The method of claim 1, wherein the nano-template is maintained at a temperature ranging from 10 to 50° C. during the self-seeding solution-application process of step (ii).

7. The method of claim 1, wherein the process of step (ii) is performed within an air-tight reactor maintained under an Ar atmosphere.

8. A single-crystalline polyalkylthiophene structure prepared by the method of claim 1.

9. The single-crystalline polyalkylthiophene structure of claim 8, which has a length of 30 nm to 200 μm and a thickness of 20 nm to 1 μm.

10. A supramolecular optoelectronic device comprising the single-crystalline polyalkylthiophene structure of claim 8.

* * * * *